(12) United States Patent
Kung et al.

(10) Patent No.: US 11,233,010 B2
(45) Date of Patent: Jan. 25, 2022

(54) ASSEMBLY STRUCTURE AND PACKAGE STRUCTURE

(71) Applicant: Advanced Semiconductor Engineering, Inc., Kaohsiung (TW)

(72) Inventors: Cheng-Yuan Kung, Kaohsiung (TW); Hung-Yi Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 94 days.

(21) Appl. No.: 16/732,157

(22) Filed: Dec. 31, 2019

(65) Prior Publication Data

US 2021/0202392 A1 Jul. 1, 2021

(51) Int. Cl.
*H01L 23/538* (2006.01)
*H01L 25/18* (2006.01)
(Continued)

(52) U.S. Cl.
CPC ...... *H01L 23/5386* (2013.01); *H01L 23/3128* (2013.01); *H01L 23/49816* (2013.01); *H01L 23/5384* (2013.01); *H01L 25/162* (2013.01); *H01L 25/165* (2013.01); *H01L 25/18* (2013.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01); *H01L 2924/1434* (2013.01); *H01L 2924/19102* (2013.01)

(58) Field of Classification Search
CPC ............. H01L 23/5386; H01L 23/3128; H01L 23/49816; H01L 25/18; H01L 25/162; H01L 25/165; H01L 23/5384; H01L 24/73; H01L 2224/73204; H01L 24/16; H01L 24/32; H01L 2224/32225; H01L 2924/1434; H01L 2224/16225; H01L 2924/19102

See application file for complete search history.

(56) References Cited

U.S. PATENT DOCUMENTS 10,224,286 B1 * 3/2019 England .................. H01L 24/73
2010/0258944 A1 * 10/2010 Uchiyama ............... H01L 24/82
257/773

(Continued)

*Primary Examiner* — Ahmed N Sefer
(74) *Attorney, Agent, or Firm* — Foley & Lardner LLP

(57) ABSTRACT

An assembly structure includes a core-computing section and a sub-computing section. The core-computing section has a first surface and a second surface opposite to the first surface. The core-computing section includes at least one conductive via electrically connecting the first surface and the second surface. The sub-computing section has a first surface stacked on the first surface of the core-computing section and a second surface opposite to the first surface. The sub-computing section includes at least one conductive via electrically connecting the first surface and the second surface. The assembly structure includes a first signal transmission path and a second signal transmission path. The first signal transmission path is between the at least one conductive via of the sub-computing section and the at least one conductive via of the core-computing section. The second signal transmission path is between the second surface of the sub-computing section and the at least one conductive via of the sub-computing section.

19 Claims, 10 Drawing Sheets

(51) Int. Cl.
*H01L 25/16* (2006.01)
*H01L 23/498* (2006.01)
*H01L 23/31* (2006.01)
*H01L 23/00* (2006.01)

(56) References Cited

U.S. PATENT DOCUMENTS

| | | | | |
|---|---|---|---|---|
| 2011/0024916 | A1* | 2/2011 | Marimuthu | H01L 23/3128 257/774 |
| 2011/0309468 | A1* | 12/2011 | Oh | H01L 25/0657 257/508 |
| 2011/0316572 | A1* | 12/2011 | Rahman | G01R 31/2853 324/754.03 |
| 2012/0248600 | A1* | 10/2012 | Shigezane | H01L 24/14 257/737 |
| 2013/0249085 | A1* | 9/2013 | Ide | H01L 23/49811 257/737 |
| 2014/0062587 | A1* | 3/2014 | Koyanagi | G11C 8/12 327/595 |
| 2015/0048500 | A1* | 2/2015 | Yu | H01L 25/18 257/737 |
| 2015/0255429 | A1* | 9/2015 | Katkar | H01L 25/0657 257/712 |
| 2015/0371938 | A1* | 12/2015 | Katkar | H01L 25/0655 257/774 |
| 2017/0179078 | A1* | 6/2017 | Jung | H01L 25/50 |
| 2019/0007045 | A1* | 1/2019 | Hirashima | H03K 19/017509 |
| 2019/0043833 | A1* | 2/2019 | Kwon | H01L 23/3185 |
| 2019/0088623 | A1* | 3/2019 | Matsumoto | H01L 22/32 |
| 2019/0198486 | A1* | 6/2019 | Kim | H01L 24/96 |
| 2019/0259695 | A1* | 8/2019 | Gandhi | H01L 23/642 |
| 2019/0279963 | A1* | 9/2019 | Woo | G01R 31/2831 |
| 2019/0348406 | A1* | 11/2019 | Nakano | H01L 23/367 |
| 2020/0006235 | A1* | 1/2020 | Aleksov | H01L 24/17 |
| 2020/0006242 | A1* | 1/2020 | Jee | H01L 25/0655 |
| 2020/0020670 | A1* | 1/2020 | Koyanagi | H01L 27/11573 |
| 2020/0381397 | A1* | 12/2020 | Yu | H01L 21/78 |
| 2020/0411473 | A1* | 12/2020 | Chen | H01L 25/50 |
| 2021/0098380 | A1* | 4/2021 | Chen | H01L 23/5389 |

* cited by examiner

ASSEMBLY STRUCTURE AND PACKAGE STRUCTURE

BACKGROUND

1. Field of the Disclosure

The present disclosure relates to an assembly structure and a package structure, and to an assembly structure including a plurality of signal transmission paths, and a package structure including the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of a semiconductor substrate may correspondingly increase, and a yield of the semiconductor substrate may decrease, which may adversely affect a yield of the semiconductor package (s). In addition, the pitch between the input/output (I/O) connections is reduced, which increases the difficulty in manufacturing process.

SUMMARY

In some embodiments, an assembly structure includes a core-computing section and a sub-computing section. The core-computing section has a first surface and a second surface opposite to the first surface. The core-computing section includes at least one conductive via electrically connecting the first surface and the second surface. The sub-computing section has a first surface stacked on the first surface of the core-computing section and a second surface opposite to the first surface. The sub-computing section includes at least one conductive via electrically connecting the first surface and the second surface. The assembly structure includes a first signal transmission path and a second signal transmission path. The first signal transmission path is between the at least one conductive via of the sub-computing section and the at least one conductive via of the core-computing section. The second signal transmission path is between the second surface of the sub-computing section and the at least one conductive via of the sub-computing section.

In some embodiments, a package structure includes a lower substrate, an upper substrate and a stacked structure disposed between the lower substrate and the upper substrate. The stacked structure includes a first electronic component and a second electronic component stacked on the first electronic component. The second electronic component is disposed between the first electronic component and the upper substrate. The package structure includes a third signal transmission path and a fourth signal transmission path. The third signal transmission path is between the lower substrate and the second electronic component through the first electronic component. The fourth signal transmission path is between the upper substrate and the second electronic component.

In some embodiments, a package structure includes an upper substrate, a processor chip, an encapsulant, a memory chip, a package body and a lower substrate. The upper substrate has a top surface and a bottom surface opposite to the top surface. The processor chip has a top surface and a bottom surface opposite to the top surface. The top surface of the processor chip is bonded to and electrically connected to the bottom surface of the upper substrate. The encapsulant is disposed on the bottom surface of the upper substrate and covers the processor chip. The memory chip has an active surface and a backside surface opposite to the active surface. The active surface of the memory chip is bonded to and electrically connected to the top surface of the upper substrate. The package body is disposed on the top surface of the upper substrate and covers the memory chip. The lower substrate is disposed on the encapsulant and electrically connects to the bottom surface of the processor chip.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
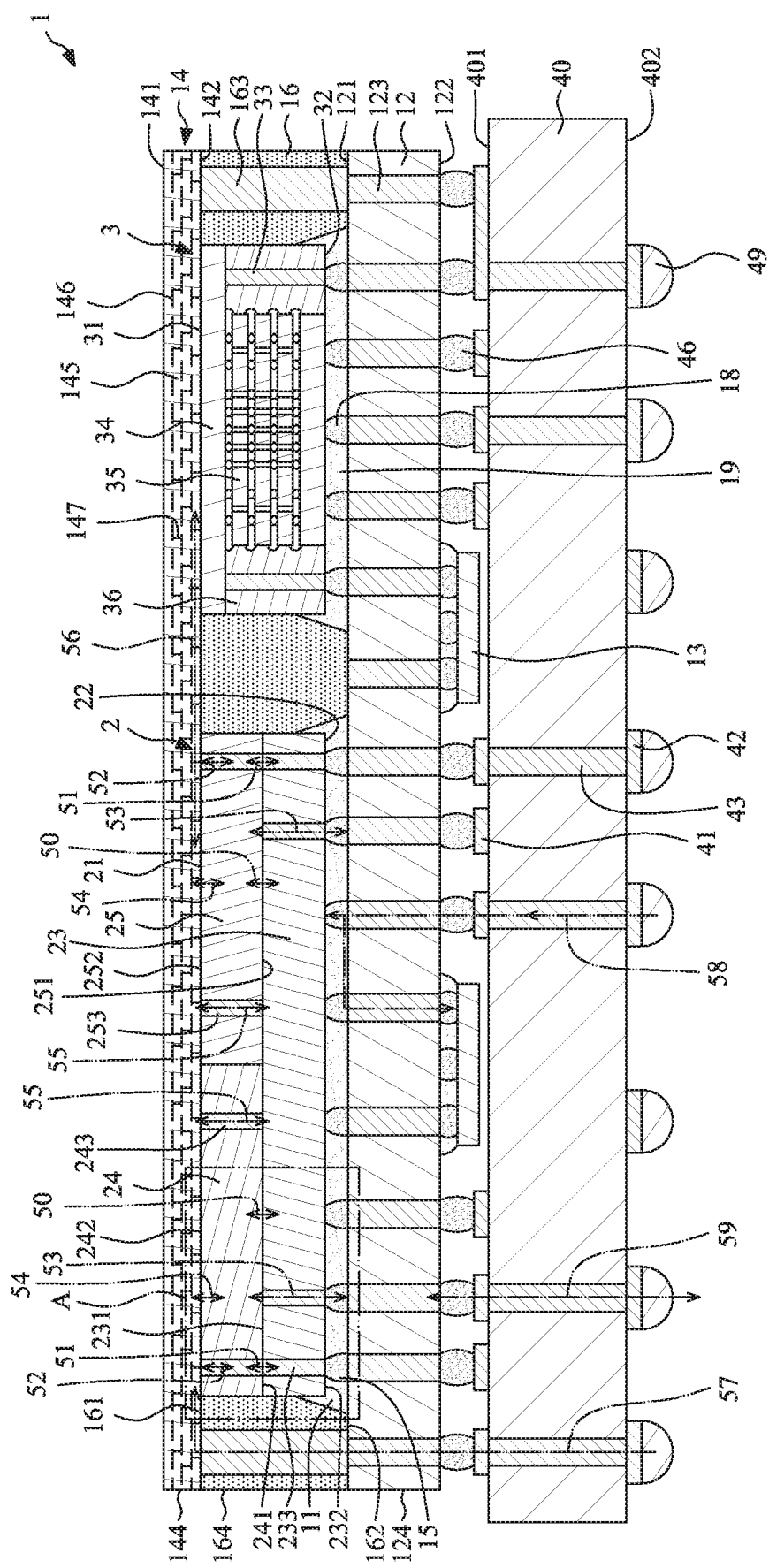
FIG. 1 illustrates a cross-sectional view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
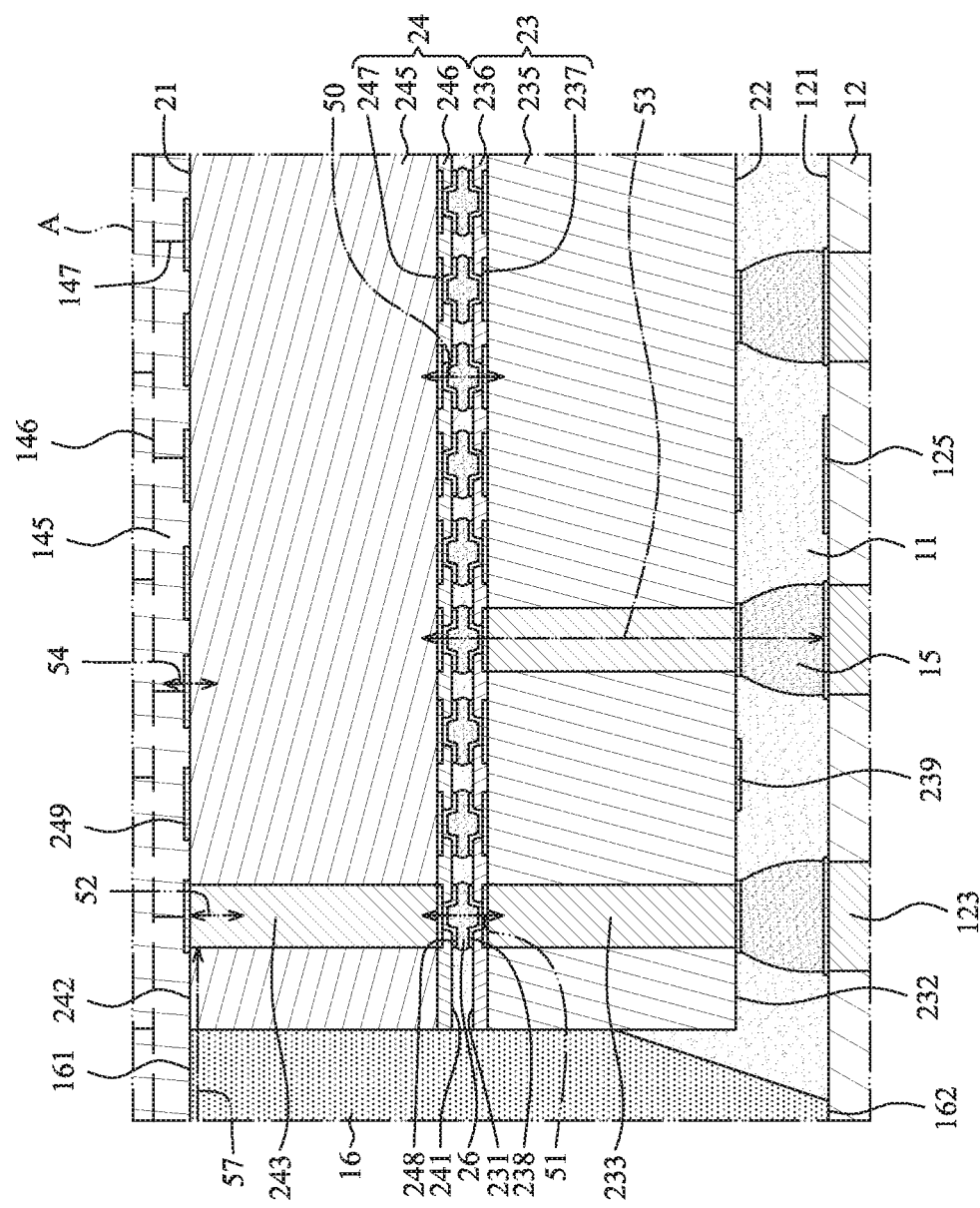
FIG. 2 illustrates an enlarged view of a region "A" in FIG. 1.

FIG. 1 illustrates a cross-sectional view of a package structure 1 according to some embodiments of the present disclosure. FIG. 2 illustrates an enlarged view of a region "A" in FIG. 1. The package structure 1 may include a lower substrate 12, an upper substrate 14, an assembly structure 2, a first electronic device (e.g., a memory device 3), an encapsulant 16, a plurality of conductive elements (e.g., conductive vias 163), a plurality of passive components 13, a plurality of solder materials 46, a package substrate 40 and a plurality of external connectors 49.

The lower substrate 12 may be an interposer or a wiring structure. As shown in FIG. 1, the lower substrate 12 may be an interposer, and a material of the lower substrate 12 may be glass or silicon. The lower substrate 12 may have a top surface 121, a bottom surface 122 opposite to the top surface 121, a lateral side surface 124 extending between the top surface 121 and the bottom surface 122. The lower substrate 12 may include a plurality of conductive vias 123 extending between the top surface 121 and the bottom surface 122. In some embodiments, the conductive vias 123 may extend through the lower substrate 12, and two ends of each of the conductive vias 123 may be exposed from the top surface 121 and the bottom surface 122 respectively. In some embodiments, there may be circuit layer(s) 125 (including, for example, traces and pads) and dielectric layer(s) disposed on the top surface 121 and the bottom surface 122 of the lower substrate 12. The circuit layer(s) 125 may be electrically connected to the conductive vias 123.

The assembly structure 2 is disposed between the lower substrate 12 and the upper substrate 14, and has a top surface 21 and a bottom surface 22 opposite to the top surface 21. The bottom surface 22 of the assembly structure 2 is bonded to and electrically connected to the lower substrate 12, and the top surface 21 of the assembly structure 2 is bonded to and electrically connected to the upper substrate 14. In some embodiments, the assembly structure 2 may be a processor chip such as an application processor (AP), a central processing unit (CPU) or a graphic processing unit (GPU). As shown in FIG. 1, the assembly structure 2 may include a first electronic component (e.g., a core-computing section 23) and at least one second electronic component (e.g., at least one sub-computing section) stacked on the first electronic component (e.g., the core-computing section 23). Thus, the assembly structure 2 may be also referred to as a "stacked structure". The second electronic component (e.g., the sub-computing section) is disposed between the first electronic component (e.g., the core-computing section 23) and the upper substrate 14.

The first electronic component (e.g., the core-computing section 23) may be a processor core or a processor unit, and may have a first surface 231 and a second surface 232 opposite to the first surface 231. In some embodiments, the first surface 231 of the core-computing section 23 may be an active surface. That is, the active electrical components (such as transistors and diodes) and routing layer(s) are disposed adjacent to the first surface 231 of the core-computing section 23. In some embodiments, there may be circuit layer(s) 239 (including, for example, traces and pads) disposed on the second surface 232 of the core-computing section 23. The second surface 232 of the core-computing section 23 may be the bottom surface 22 of the assembly structure 2. Further, the second surface 232 of the core-computing section 23 (e.g., the bottom surface 22 of the assembly structure 2) may be bonded to and electrically connected to the top surface 121 of the lower substrate 12 through the solder materials 15. An underfill 11 may be disposed in a space between the core-computing section 23 of the assembly structure 2 and the lower substrate 12 to cover and protect the solder materials 15. In some embodiments, the core-computing section 23 may include at least one conductive via 233 extending between and electrically connecting the first surface 231 and the second surface 232. The conductive via 233 may extend through the core-computing section 23, and two ends of each of the conductive vias 223 may be exposed from the first surface 231 and the second surface 232 respectively for electrical connection.

The at least one second electronic component (e.g., at least one sub-computing section) may include at least one memory component 24 and at least one signal transmission component 25 disposed on the core-computing section 23 side by side with each other. For example, the memory component 24 may be a static random access memory (SRAM) chip, and may have a first surface 241 and a second surface 242 opposite to the first surface 241. In some embodiments, the first surface 241 of the memory component 24 may be an active surface. That is, the active electrical components (such as transistors and diodes) and routing layer(s) are disposed adjacent to the first surface 241 of the memory component 24. In some embodiments, there may be circuit layer(s) 249 (including, for example, traces and pads) disposed on the second surface 242 of the second electronic component (e.g., the sub-computing section such as the memory component 24). The second surface 242 of the memory component 24 may be a portion of the top surface 21 of the assembly structure 2. In some embodiments, the memory component 24 may include at least one conductive via 243 extending between and electrically connecting the first surface 241 and the second surface 242. The conductive via 243 may extend through the memory component 24, and two ends of each of the conductive vias 243 may be exposed from the first surface 241 and the second surface 242 respectively for electrical connection. As shown in FIG. 1, the first surface 241 of the at least one second electronic component (e.g., the sub-computing section such as the memory component 24) is bonded to and electrically connected to the first surface 231 of the core-computing section 23. That is, the first surface 241 (e.g., the active surface) of the at least one second electronic component (e.g., the sub-computing section such as the memory component 24) faces the first surface 231 (e.g., the active surface) of the core-computing section 23.

The signal transmission component 25 may be a physical layer (PHY) chip with a serializer/deserializer (SerDes) for transmitting signals (e.g., data signals, power signals and ground signals), and may have a first surface 251 and a second surface 252 opposite to the first surface 251. In some embodiments, the first surface 251 of the signal transmission component 25 may be an active surface. That is, the active electrical components (such as transistors and diodes) and routing layer(s) are disposed adjacent to the first surface 251 of the signal transmission component 25. In some embodiments, there may be circuit layer(s) (including, for example, traces and pads) disposed on the second surface 252 of the non-computing section (e.g., the signal transmission component 25). The second surface 252 of the signal transmission component 25 may be a portion of the top surface 21 of the assembly structure 2. In some embodiments, the signal transmission component 25 may include at least one conductive via 253 extending between and electrically connecting the first surface 251 and the second surface 252. The conductive via 253 may extend through the signal transmission component 25, and two ends of each of the conductive vias 253 may be exposed from the first surface 251 and the second surface 252 respectively for electrical connection. As shown in FIG. 1, the first surface 251 of the at least one second electronic component (e.g., the sub-computing section such as the signal transmission component 25) is bonded to and electrically connected to the first surface 231 of the core-computing section 23. That is, the first surface 251 (e.g., the active surface) of the at least one second electronic component (e.g., the sub-computing section such as the signal transmission component 25) faces the first surface 231 (e.g., the active surface) of the core-computing section 23.

The first electronic device (e.g., the memory device 3) is disposed between the lower substrate 12 and the upper substrate 14, and has a top surface 31 and a bottom surface 32 opposite to the top surface 31. The bottom surface 32 of the memory device 3 is bonded to and electrically connected to the top surface 121 of the lower substrate 12 through the solder materials 18, and the top surface 31 of the memory device 3 is bonded to and electrically connected to the upper substrate 14. An underfill 19 may be disposed in a space between the memory device 3 and the lower substrate 12 to cover and protect the solder materials 18. In some embodiments, the memory device 3 may be a memory chip such as a high bandwidth memory (HBM) chip. As shown in FIG. 1, the memory device 3 may include a substrate 34, a plurality of memory dice 35, an encapsulant 36 and a plurality of conductive via 33. The memory dice 35 may be stacked on the substrate 34. The encapsulant 36 may cover the substrate 34 and the memory dice 35. The conductive via 33 may extend through the encapsulant 36 and electrically connect the substrate 34. A top surface of the substrate 34 may be the top surface 31 of the memory device 3, and a bottom surface of the encapsulant 36 may be the bottom surface 32 of the memory device 3. One end of the conductive via 33 may be exposed from the bottom surface 32 of the memory device 3 (e.g., the bottom surface of the encapsulant 36) for electrical connection. In some embodiments, there may be circuit layer(s) (including, for example, traces and pads) disposed on the bottom surface 32 of the memory device 3 (e.g., the bottom surface of the encapsulant 36). The conductive via 33 electrically connects the top surface 31 and the bottom surface 32. In some embodiments, the first electronic device (e.g., the memory device 3) may electrically connect to the core-computing section 23 through the upper substrate 14 and the signal transmission component 25.

The encapsulant 16 is disposed between the lower substrate 12 and the upper substrate 14 to cover the assembly structure 2, the memory device 3 and the conductive elements (e.g., the conductive vias 163). The encapsulant 16 may be a molding compound with or without fillers. As shown in FIG. 1, the encapsulant 16 may include a top surface 161, a bottom surface 162 opposite to the top surface 161, and a lateral side surface 164 extending between the top surface 161 and the bottom surface 162. The bottom surface 162 of the encapsulant 16 may be disposed on or attached to the top surface 121 of the lower substrate 12, and the top surface 161 of the encapsulant 16 may be disposed on or attached to a bottom surface 142 of the upper substrate 14. In some embodiments, the conductive elements (e.g., the conductive vias 163) are disposed adjacent to the assembly structure 2 to electrically connect the lower substrate 12 and the upper substrate 14. As shown in FIG. 1, the conductive vias 163 may extend through the encapsulant 16, and two ends of each of the conductive vias 163 may be exposed from the top surface 161 and the bottom surface 162 respectively for electrical connection.

The upper substrate 14 may be formed or disposed on the top surface 161 of the encapsulant 16, the top surface 21 of the assembly structure 2 and the top surface 31 of the memory device 3, and may contact the conductive vias 163. Thus, the conductive vias 163 electrically connect the upper substrate 14 and the lower substrate 12. Further, the assembly structure 2 may be electrically connected to the memory device 3 through the upper substrate 14. As shown in FIG. 1, the upper substrate 14 may have a top surface 141, a bottom surface 142 opposite to the top surface 141, and a lateral side surface 144 extending between the top surface 141 and the bottom surface 142. The upper substrate 14 may be a wiring structure, and may include a dielectric structure 145, at least one circuit layer 146 and a plurality of inner vias 147. In some embodiments, the upper substrate 14 may be formed by a build-up technique. As shown in FIG. 1, the dielectric structure 145 may include at least one dielectric layer. A material of the dielectric layer may include an insulating material, a passivation material, a dielectric material or a solder resist material, such as, for example, a benzocyclobutene (BCB) based polymer or a polyimide (PI). In some embodiments, the dielectric layer may be made of a photoimageable material. In some embodiments, the lateral side surface 144 of the upper substrate 14, the lateral side surface 164 of the encapsulant 16 and the lateral side surface 124 of the lower substrate 12 may be substantially coplanar with each other.

The at least one circuit layer 146 may include a plurality of circuit layers 146 in contact with or embedded in the dielectric structure 145. Each of the circuit layers 146 may be a fan-out circuit layer 146 or a redistribution layer (RDL). A material of the circuit layer 146 may include, for example, copper, another conductive metal, or an alloy thereof. A line width/line space (L/S) of the circuit layer 146 may be less than or equal to about 5 µm/about 5 µm, or less than or equal to about 2 µm/about 2 µm, or less than or equal to about 1.8 µm/about 1.8 µm. Some of the inner vias 147 may be disposed between two adjacent circuit layers 146 for electrically connecting the circuit layers 146. Some of the inner vias 147 may be disposed between the circuit layer 146 and the top surface 21 of the assembly structure 2 for electrically connecting the circuit layer 146 and the assembly structure 2. Some of the inner vias 147 may be disposed between the circuit layer 146 and the top surface 31 of the memory device 3 for electrically connecting the circuit layer 146 and the memory device 3.

The passive components 13 are bonded to and electrically connected to the bottom surface 122 of the lower substrate 12. The passive components 13 may include decoupling capacitors. In addition, the solder materials 46 (e.g., solder balls) are disposed adjacent to the bottom surface 122 of the lower substrate 12 for external connection. The solder materials 46 may be disposed on the circuit layer on or exposed from the bottom surface 122 of the lower substrate 12.

The package substrate 40 may include a glass reinforced epoxy material (such as FR4), bismaleimide triazine (BT), epoxy resin, silicon, printed circuit board (PCB) material, glass, ceramic or photoimageable dielectric (PID) material. The package substrate 40 may have a top surface 401 and a bottom surface 402 opposite to the top surface 401. As shown in FIG. 1, the package substrate 40 may include a first circuit layer 41, a second circuit layer 42, and a plurality of conductive vias 43. The first circuit layer 41 may be disposed adjacent to the top surface 401 of the package substrate 40, and the second circuit layer 42 may be disposed adjacent to the bottom surface 402 of the package substrate 40. The conductive vias 43 may extend through the package substrate 40 and electrically connect the first circuit layer 41 and the second circuit layer 42. In some embodiments, the lower substrate 12 is bonded to and electrically connected to the first circuit layer 41 of the package substrate 40 through the solder materials 46. In addition, the external connectors 49 (e.g., solder balls) are formed or disposed on the second circuit layer 42 of the package substrate 40 for external connection.

In the embodiment illustrated in FIG. 1, the package structure 1 and the assembly structure 2 may include the following signal transmission paths: an interconnection signal transmission path 50, a first signal transmission path 51, a second signal transmission path 52, a third signal transmission path 53, a fourth signal transmission path 54, a fifth signal transmission path 55, an inner signal transmission path 56, a seventh signal transmission path 57, an eighth signal transmission path 58 and a ninth signal transmission path 59. The interconnection signal transmission path 50 is between the first surface 241 (or the first surface 251) (e.g., the active surface) of the second electronic component (e.g., the sub-computing section such as the memory component 24 and the signal transmission component 25) and the first surface 231 (e.g., the active surface) of the first electronic component (e.g., the core-computing section 23) without any conductive via. The first signal transmission path 51 is between the conductive via 243 of the sub-computing section(s) (e.g., the memory component 24 and the signal transmission component 25) and the conductive via 233 of the core-computing section 23. Since the interconnection signal transmission path 50 and the first signal transmission path 51 both extend through the interface between the first surface 241 (or the first surface 251) (e.g., the active surface) of the second electronic component (e.g., the sub-computing section such as the memory component 24 and the signal transmission component 25) and the first surface 231 (e.g., the active surface) of the first electronic component (e.g., the core-computing section 23), the signal transmission speeds in the interconnection signal transmission path 50 and the first signal transmission path 51 are high. That is, a high-speed signal transmission is achieved in the interconnection signal transmission path 50 and the first signal transmission path 51, and high-speed signals may be transmitted in the interconnection signal transmission path 50 and the first signal transmission path 51. In some embodiments, the signal transmission speed in the interconnection signal transmission path 50 may be greater than the signal transmission speed in the first signal transmission path 51.

The second signal transmission path 52 is between the second surface 242 (or the second surface 252) of the sub-computing section (such as the memory component 24 and the signal transmission component 25) and the conductive via 243 (or the conductive via 253) of the sub-computing section (such as the memory component 24 and the signal transmission component 25). The signal transmission speeds in the interconnection signal transmission path 50 and the first signal transmission path 51 may be greater than a signal transmission speed in the second signal transmission path 52. In addition, the first surface 241 and the second surface 242 of the sub-computing section (such as the memory component 24) both have electrical connection function and signal transmission function. The first surface 251 and the second surface 252 of the signal transmission component 25 both have electrical connection function and signal transmission function.

The third signal transmission path 53 is between the lower substrate 12 and the second electronic component (e.g., the sub-computing section such as the memory component 24 and the signal transmission component 25) through the first electronic component (e.g., the core-computing section 23). Thus, the first surface 231 and the second surface 232 of the first electronic component (e.g., the core-computing section 23) both have electrical connection function and signal transmission function. In some embodiments, the third signal transmission path 53 may be disposed in the conductive via 233 of the core-computing section 23.

The fourth signal transmission path 54 is between the upper substrate 14 and the second electronic component (e.g., the sub-computing section such as the memory component 24 and the signal transmission component 25). Thus, the top surface 21 and the bottom surface 22 of the assembly structure 2 both have electrical connection function and signal transmission function.

The fifth signal transmission path 55 is between the upper substrate 14 and the first electronic component (e.g., the core-computing section 23) through the second electronic component (e.g., the sub-computing section such as the memory component 24 and the signal transmission component 25).

The inner signal transmission path 56 is between the first electronic device (e.g., the memory device 3) and the second electronic component (e.g., the sub-computing section such as the memory component 24 and the signal transmission component 25). In some embodiments, the inner signal transmission path 56 may be disposed in the upper substrate 14, and data signals are transmitted in the inner signal transmission path 56. The first electronic component (e.g., the core-computing section 23) may communicate with the first electronic device (e.g., the memory device 3) through the second electronic component (e.g., the sub-computing section such as the signal transmission component 25) and the inner signal transmission path 56.

The seventh signal transmission path 57 may include the external connector 49, the conductive via 123 of the lower substrate 12, the conductive element (e.g., the conductive via 163), the second surface 242 of the sub-computing section (such as the memory component 24) and the conductive via 243. In some embodiments, power signals may be transmitted in the seventh signal transmission path 57. Thus, a power signal may be transmitted to the conductive via 243 through the second surface 242 of the sub-computing section (such as the memory component 24).

The eighth signal transmission path 58 may include the external connector 49, the conductive via 123 of the lower substrate 12 and the passive component 13. In some embodiments, power signals may be transmitted in the eighth signal transmission path 58. Thus, a power signal may be transmitted to the passive component 13 through the eighth signal transmission path 58.

The ninth signal transmission path 59 may include the external connector 49 and the conductive via 123 of the lower substrate 12. In some embodiments, exterior data signals may be transmitted in the ninth signal transmission path 59. Thus, an exterior data signal may be transmitted to the assembly structure 2 through the ninth signal transmission path 59.

Referring to FIG. 2, the memory component 24 may include a main body 245, a layout layer 247, a passivation layer 246, a plurality of electrical contacts 248 and a circuit layer 249. The main body 245 may be a silicon base. The conductive via 243 may extend through the main body 245. The layout layer 247 may be disposed on a bottom surface of the main body 245, and may be disposed adjacent to the first surface 241 of the memory component 24. A portion of the layout layer 247 may cover or electrically connect one end of the conductive via 243. The passivation layer 246 may be disposed on the bottom surface of the main body 245 to cover the layout layer 247. The passivation layer 246 may define a plurality of openings to expose portions of the layout layer 247. The electrical contacts 248 may be under bump metallizations (UBMs) that are disposed in the openings of the passivation layer 246 to contact the exposed portions of the layout layer 247. The electrical contacts 248 do not fill the openings of the passivation layer 246. The circuit layer 249 may be disposed on a top surface of the main body 245 (e.g., the second surface 242 of the memory component 24). A portion of the circuit layer 249 may cover or electrically connect the other end of the conductive via 243.

The core-computing section 23 may include a main body 235, a layout layer 237, a passivation layer 236, a plurality of electrical contacts 238 and a circuit layer 239. The main body 235 may be a silicon base. The conductive via 233 may extend through the main body 235. The layout layer 237 may be disposed on a top surface of the main body 235, and may be disposed adjacent to the first surface 231 of the core-computing section 23. A portion of the layout layer 237 may cover or electrically connect one end of the conductive via 233. The passivation layer 236 may be disposed on the top surface of the main body 235 to cover the layout layer 237. The passivation layer 236 may define a plurality of openings to expose portions of the layout layer 237. The electrical contacts 238 may be under bump metallizations (UBMs) that are disposed in the openings of the passivation layer 236 to contact the exposed portions of the layout layer 237. The electrical contacts 238 do not fill the openings of the passivation layer 236. The circuit layer 239 may be disposed on a bottom surface of the main body 235 (e.g., the second surface 232 of the core-computing section 23). A portion of the circuit layer 239 may cover or electrically connect the other end of the conductive via 233. As shown in FIG. 2, the electrical contacts 248 of the memory component 24 are bonded to the electrical contacts 238 of the core-computing section 23 through a plurality of solder materials 26, so that the first surface 241 of the memory component 24 is bonded to the first surface 231 of the core-computing section 23.

Figure 3:
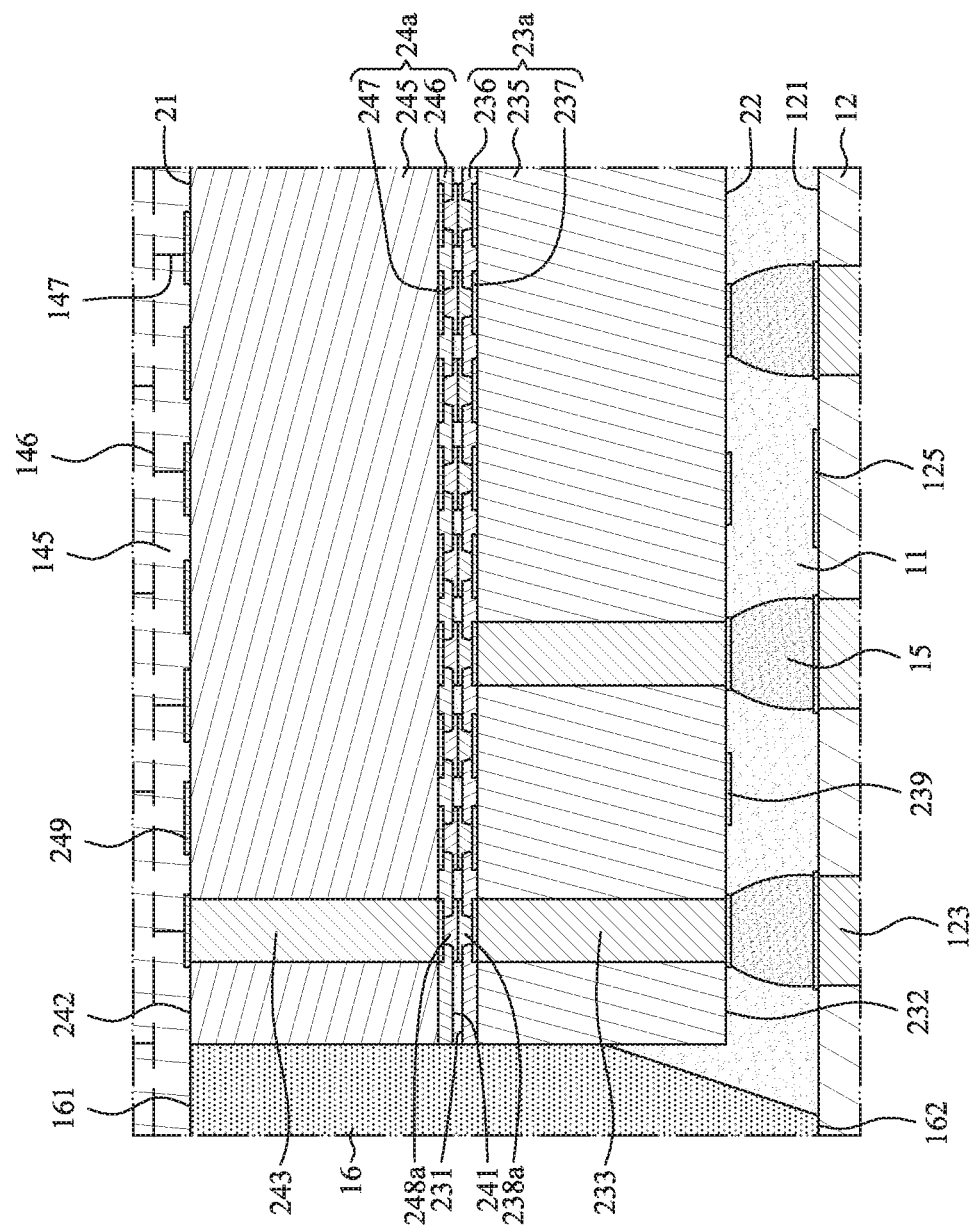
FIG. 3 illustrates a cross-sectional view of an enlarged view of a region of a package structure according to some embodiments of the present disclosure.

FIG. 3 illustrates a cross-sectional view of an enlarged view of a region of a package structure according to some embodiments of the present disclosure. The structure of FIG. 3 is similar to the structure of FIG. 2, except for structures of the electrical contacts 248a of the memory component 24a and the electrical contacts 238a of the core-computing section 23a. As shown in FIG. 3, each of the electrical contacts 248a may be a pad that fills the opening of the passivation layer 246. Further, each of the electrical contacts 238a may be a pad that fills the opening of the passivation layer 236. The electrical contacts 248a of the memory component 24a may connect or contact the electrical contacts 238a of the core-computing section 23a directly.

Figure 4:
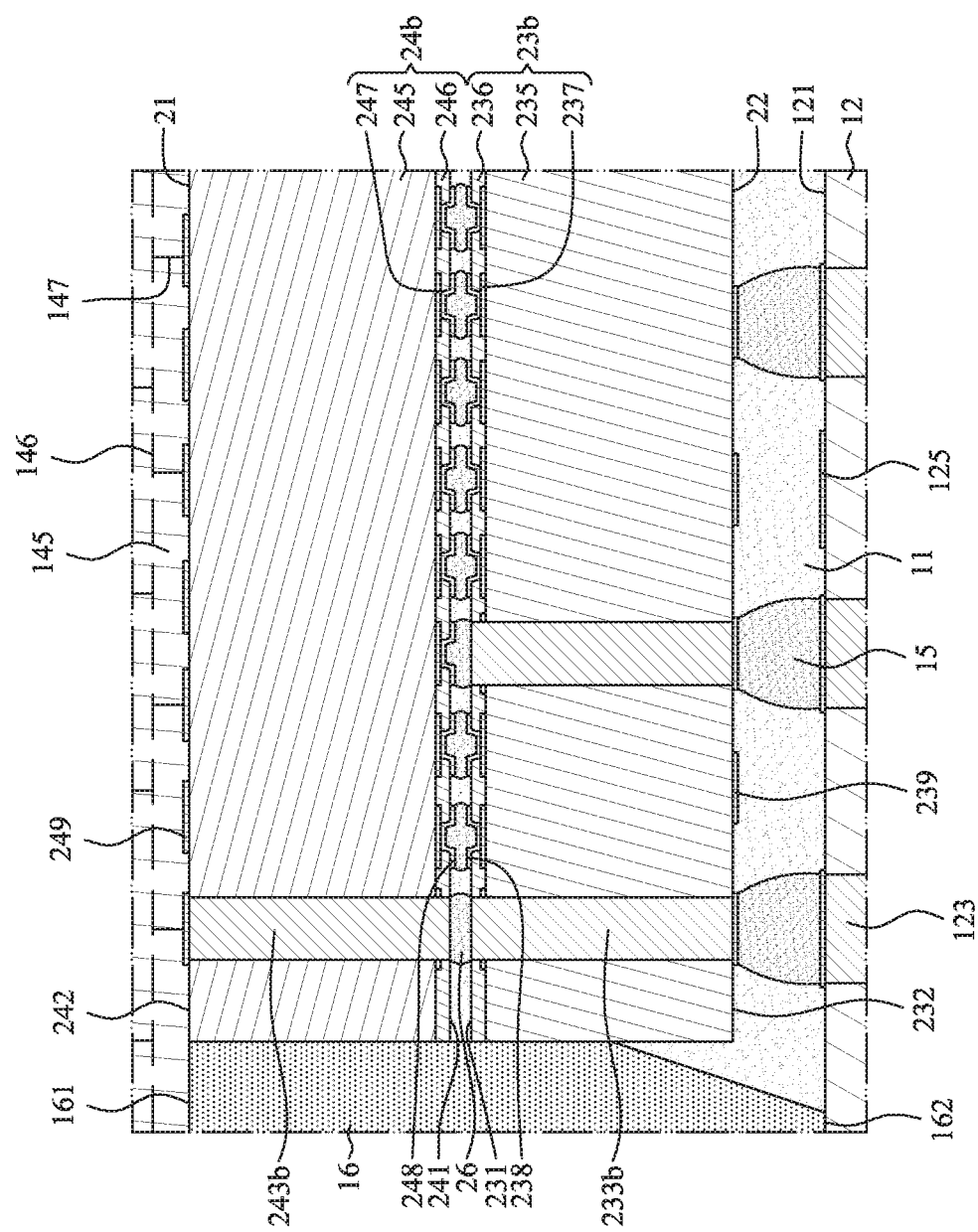
FIG. 4 illustrates a cross-sectional view of an enlarged view of a region of a package structure according to some embodiments of the present disclosure.

FIG. 4 illustrates a cross-sectional view of an enlarged view of a region of a package structure according to some embodiments of the present disclosure. The structure of FIG. 4 is similar to the structure of FIG. 2, except for structures of the conductive via 243b of the memory component 24b and the conductive via 233b of the core-computing section 23b. As shown in FIG. 4, the conductive via 243b of the memory component 24b may further extend through a portion of the layout layer 247 and the passivation layer 246. The conductive via 233b of the core-computing section 23b may further extend through a portion of the layout layer 237 and the passivation layer 236. The conductive via 243b of the memory component 24b may further extend through a portion of the layout layer 247 and the passivation layer 246. The conductive via 233b may be bonded to the conductive via 243b through the solder materials 26.

Figure 5:
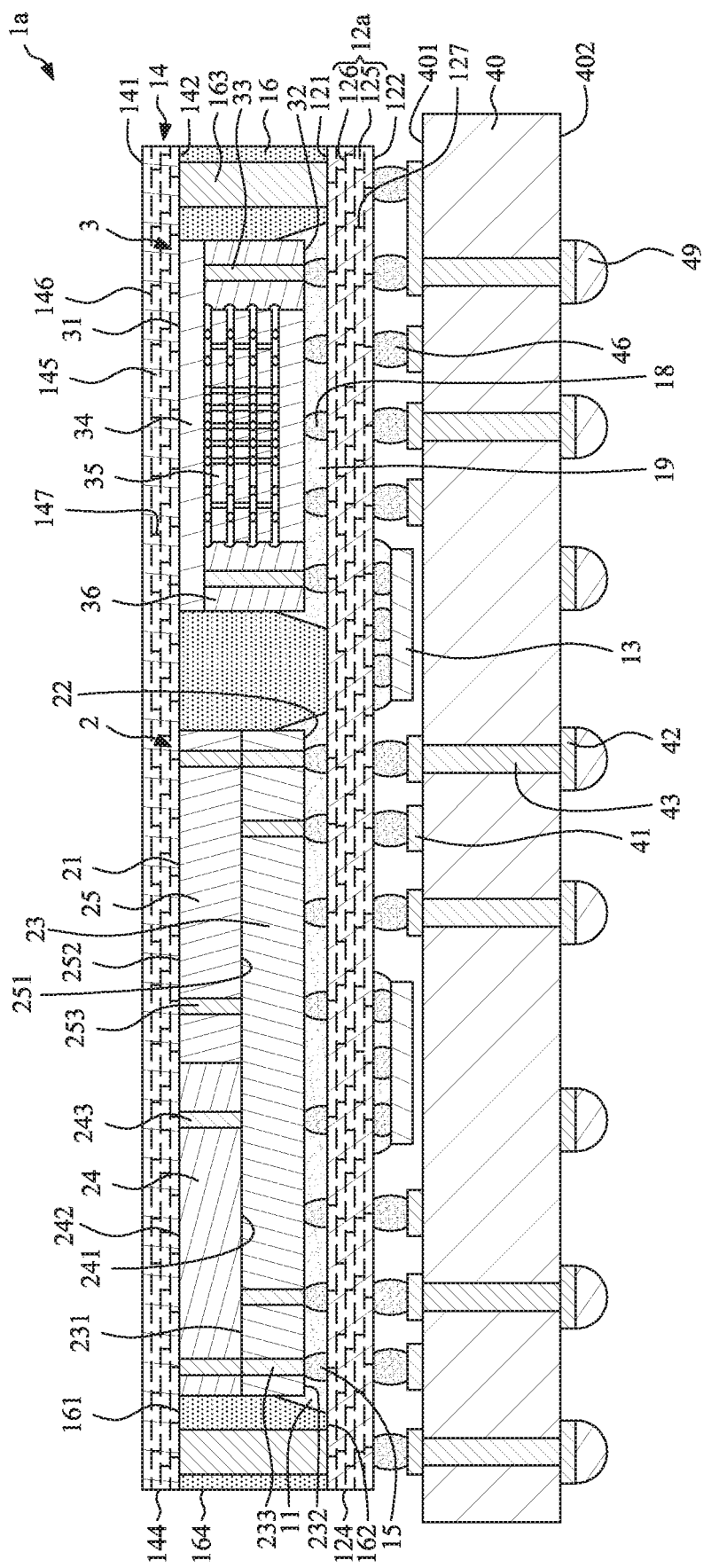
FIG. 5 illustrates a cross-sectional view of an enlarged view of a region of a package structure according to some embodiments of the present disclosure.

FIG. 5 illustrates a cross-sectional view of an example of a package structure 1a according to some embodiments of the present disclosure. The package structure 1a of FIG. 5 is similar to the package structure 1 of FIG. 1, except for a structure of the lower substrate 12a. As shown in FIG. 5, the lower substrate 12a may be a wiring structure. The lower substrate 12a may have a top surface 121, a bottom surface 122 opposite to the top surface 121, and a lateral side surface 124 extending between the top surface 121 and the bottom surface 122. The lower substrate 12a may include a dielectric structure 125, at least one circuit layer 126 and a plurality of inner vias 127. In some embodiments, the lower substrate 12a may be formed by a build-up technique. As shown in FIG. 5, the dielectric structure 125 may include at least one dielectric layer. A material of the dielectric layer may include an insulating material, a passivation material, a dielectric material or a solder resist material, such as, for example, a benzocyclobutene (BCB) based polymer or a polyimide (PI). In some embodiments, the dielectric layer may be made of a photoimageable material.

The at least one circuit layer 126 may include a plurality of circuit layers 126 in contact with or embedded in the dielectric structure 125. Each of the circuit layers 126 may be a fan-out circuit layer 126 or a redistribution layer (RDL). A material of the circuit layer 126 may include, for example, copper, another conductive metal, or an alloy thereof. A line width/line space (L/S) of the circuit layer 126 may be less than or equal to about 5 µm/about 5 µm, or less than or equal to about 2 µm/about 2 µm, or less than or equal to about 1.8 µm/about 1.8 µm. Some of the inner vias 127 may be disposed between two adjacent circuit layers 126 for electrically connecting the circuit layers 146.

Figure 6:
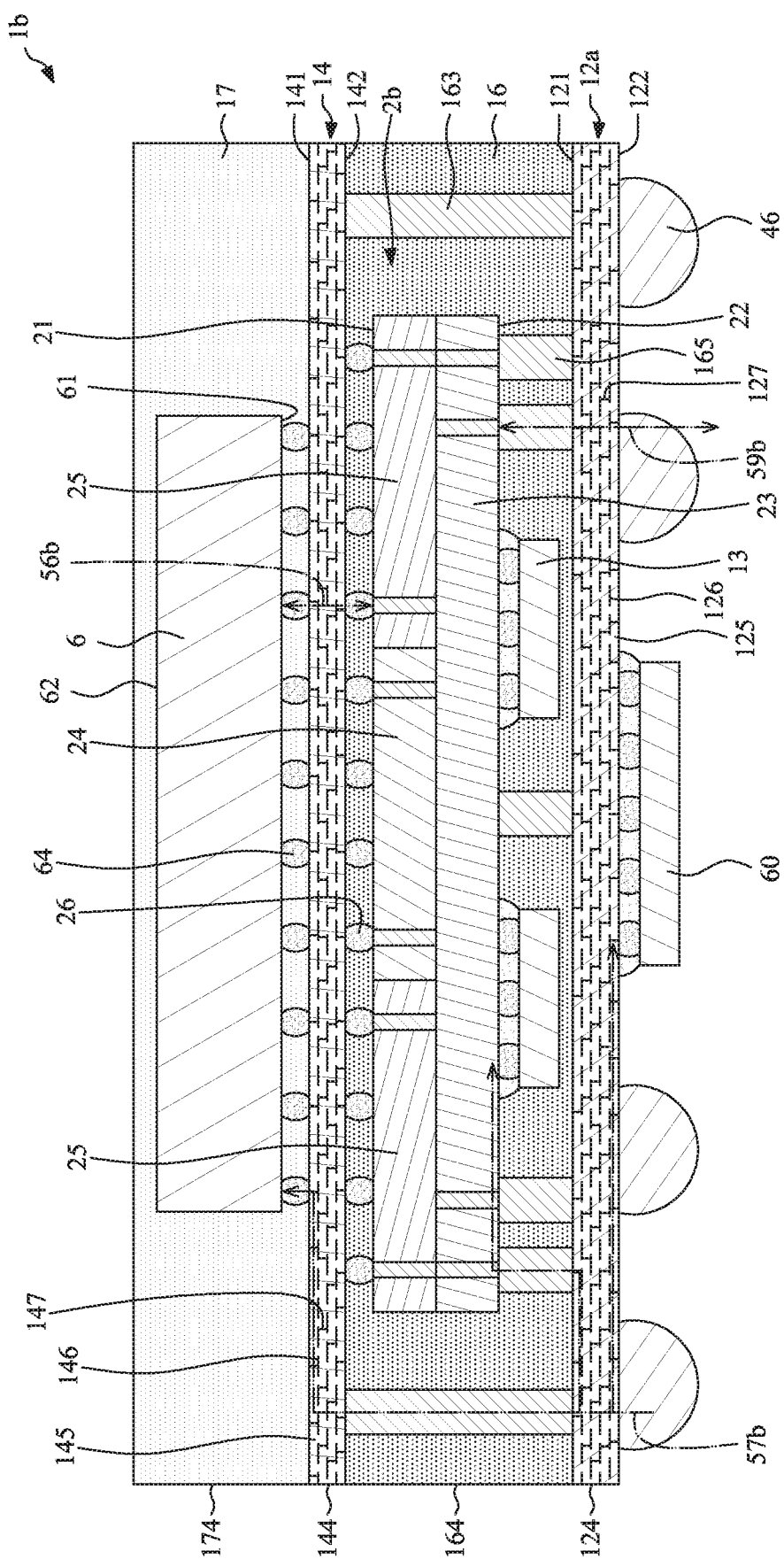
FIG. 6 illustrates a cross-sectional view of an example of a package structure according to some embodiments of the present disclosure.

FIG. 6 illustrates a cross-sectional view of an example of a package structure 1b according to some embodiments of the present disclosure. The package structure 1b of FIG. 6 is similar to the package structure 1a of FIG. 5, and the differences are described as follows. The first electronic device 3 and the package substrate 40 of FIG. 5 are omitted. The package structure 1b further includes a second electronic device (e.g., a memory device 6), a package body 17 and at least one bottom passive component 60. In some embodiments, the second electronic device 6 may be a memory chip such as a dynamic random access memory (DRAM) chip, and may have an active surface 61 and a backside surface 62 opposite to the active surface 61. The active surface 61 of the second electronic device (e.g., the memory device 6) may be bonded to and electrically connected to the top surface 141 of the upper substrate 14 through the solder materials 64. The package body 17 (e.g., a molding compound) may be disposed on the top surface 141 of the upper substrate 14 to cover the second electronic device (e.g., the memory device 6).

The assembly structure 2b further includes a signal transmission component 25. The top surface 21 of the assembly structure 2b may be bonded to and electrically connected to the bottom surface 141 of the upper substrate 14 through the solder materials 26. The bottom surface 22 of the assembly structure 2b may be electrically connected to the top surface 121 of the lower substrate 12a through a plurality of conductive vias 165. In addition, the passive components 13 are bonded to and electrically connected to the bottom surface 22 of the assembly structure 2b. Thus, the passive components 13 are disposed between the assembly structure 2b and the lower substrate 12a.

The bottom passive component 60 is bonded to and electrically connected to the bottom surface 122 of the lower substrate 12a. The bottom passive component 60 may include a decoupling capacitor. The solder materials 46 may be disposed on the circuit layer on or exposed from the bottom surface 122 of the lower substrate 12a. In some embodiments, the lateral side surface 144 of the upper substrate 14, the lateral side surface 164 of the encapsulant 16, the lateral side surface 124 of the lower substrate 12a and a lateral side surface of the package body 17 may be substantially coplanar with each other.

The package structure 1b may include the following signal transmission paths: an inner signal transmission path 56b, a seventh signal transmission path 57b and a ninth signal transmission path 59b. The inner signal transmission path 56b is between the second electronic device (e.g., the memory device 6) and the second electronic component (e.g., the sub-computing section such as the memory component 24 and the signal transmission component 25). In some embodiments, the inner signal transmission path 56b may extend through the upper substrate 14, and data signals are transmitted in the inner signal transmission path 56b.

In some embodiments, power signals may be transmitted in the seventh signal transmission path 57b. As shown in FIG. 6, some of the power signals may be transmitted to the bottom passive component 60 through a first branch of the seventh signal transmission path 57b that includes the lower substrate 12a. Some of the power signals may be transmitted to the passive components 13 through a second branch of the seventh signal transmission path 57b that includes the lower substrate 12a, the conductive via 165 and the core-computing section 23. Some of the power signals may be transmitted to the second electronic device (e.g., the memory device 6) through a third branch of the seventh signal transmission path 57b that includes the lower substrate 12a, the conductive via 163 and the upper substrate 14.

In some embodiments, exterior data signals may be transmitted to the assembly structure 2b through the ninth signal transmission path 59b that includes the lower substrate 12a and the conductive via 165.

Figure 7:
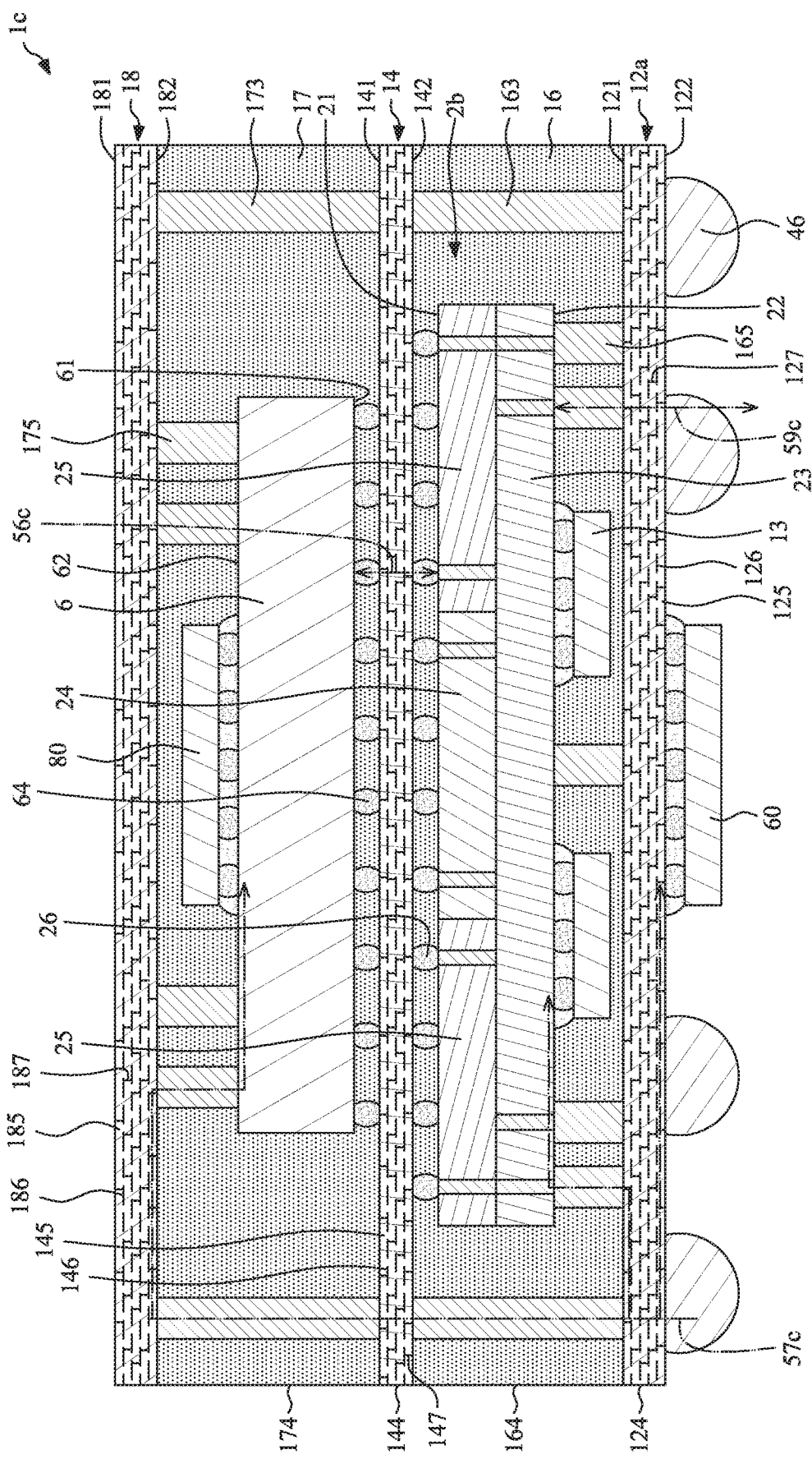
FIG. 7 illustrates a cross-sectional view of an example of a package structure according to some embodiments of the present disclosure.

FIG. 7 illustrates a cross-sectional view of an example of a package structure 1c according to some embodiments of the present disclosure. The package structure 1c of FIG. 7 is similar to the package structure 1b of FIG. 6, except that a top substrate 18, a top passive component 80, a plurality of through vias 173 and a plurality of conductive vias 175 are further included. The top substrate 18 may be disposed on the package body 17. As shown in FIG. 7, the top substrate 18 may be a wiring structure, and may have a top surface 181 and a bottom surface 182 opposite to the top surface 181. The top substrate 18 may include a dielectric structure 185, at least one circuit layer 186 and a plurality of inner vias 187. In some embodiments, the top substrate 18 may be formed by a build-up technique. The dielectric structure 185 may include at least one dielectric layer. The at least one circuit layer 186 may include a plurality of circuit layers 186 in contact with or embedded in the dielectric structure 185. Each of the circuit layers 186 may be a fan-out circuit layer 126 or a redistribution layer (RDL). Some of the inner vias 187 may be disposed between two adjacent circuit layers 126 for electrically connecting the circuit layers 146.

In some embodiments, the top passive component 80 may be bonded to and electrically connected to the backside surface 62 of the second electronic device (e.g., the memory device 6). The top passive component 80 may include a decoupling capacitor. Further, the bottom surface 182 of the top substrate 18 may be electrically connected to the backside surface 62 of the second electronic device (e.g., the memory device 6) through the conductive vias 175 embedded in the package body 17. In addition, each of the through vias 173 may extend through the package body 17, and may electrically connect the top substrate 18 and the upper substrate 14.

The package structure 1c may include the following signal transmission paths: an inner signal transmission path 56c, a seventh signal transmission path 57c and a ninth signal transmission path 59c. The inner signal transmission path 56c and the ninth signal transmission path 59c are same as the inner signal transmission path 56b and the ninth signal transmission path 59b of FIG. 6, respectively. Further, some of the power signals may be transmitted to the bottom passive component 60 through a first branch of the seventh signal transmission path 57c that includes the lower substrate 12a. Some of the power signals may be transmitted to the passive components 13 through a second branch of the seventh signal transmission path 57c that includes the lower substrate 12a, the conductive via 165 and the core-computing section 23. Some of the power signals may be transmitted to the top passive component 80 through a third branch of the seventh signal transmission path 57c that includes the lower substrate 12a, the conductive via 163, the upper substrate 14, the through via 173, the top substrate 18, the conductive via 175 and the second electronic device (e.g., the memory device 6).

Figure 8:
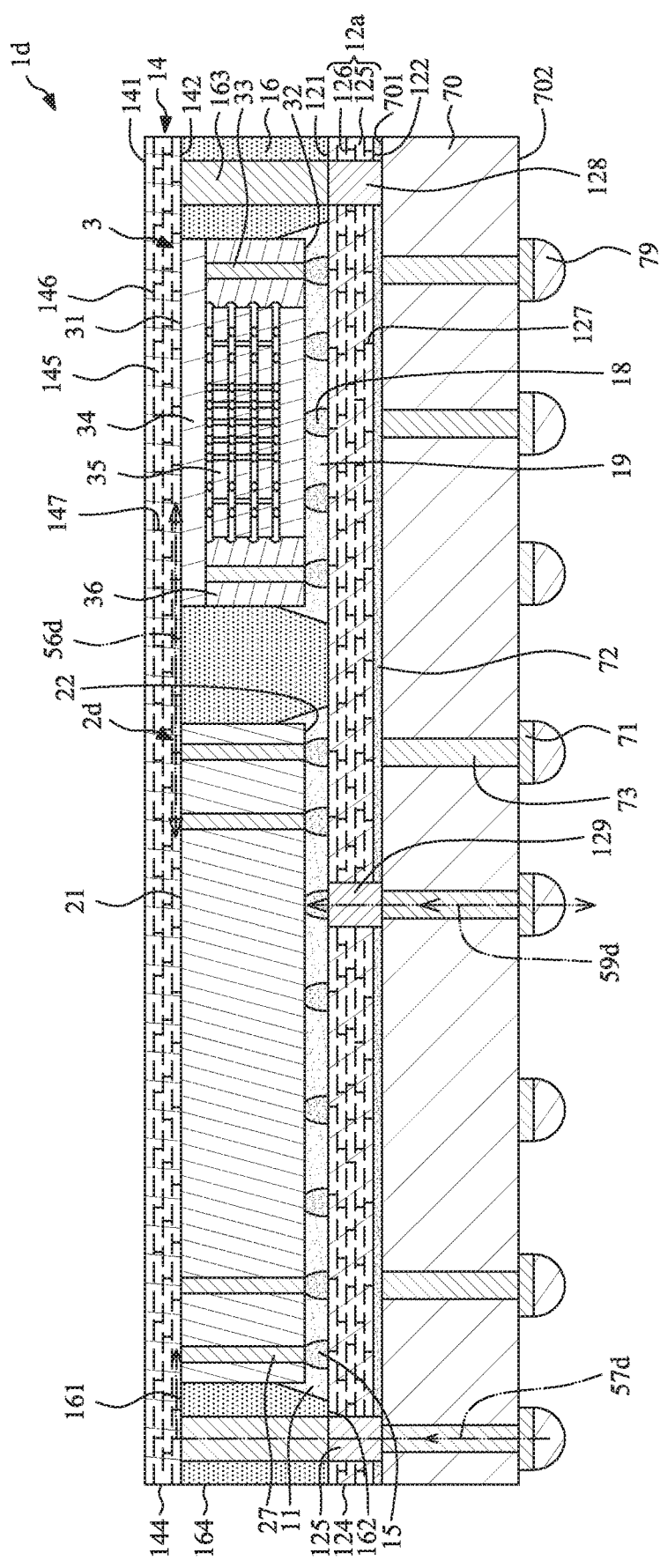
FIG. 8 illustrates a cross-sectional view of an example of a package structure according to some embodiments of the present disclosure.

FIG. 8 illustrates a cross-sectional view of an example of a package structure 1d according to some embodiments of the present disclosure. The package structure 1d of FIG. 8 is similar to the package structure 1a of FIG. 5, and the differences are described as follows. The assembly structure 2 of FIG. 5 is replaced by a semiconductor chip 2d. In some embodiments, the semiconductor chip 2d may be a graphics processing unit (GPU). The semiconductor chip 2d is disposed between the lower substrate 12a and the upper substrate 14, and has a top surface 21 and a bottom surface 22 opposite to the top surface 21. The bottom surface 22 of the semiconductor chip 2d is bonded to and electrically connected to the lower substrate 12a, and the top surface 21 of the semiconductor chip 2d is bonded to and electrically connected to the upper substrate 14. The semiconductor chip 2d may include a plurality of conductive vias 27 extending through the semiconductor chip 2d.

The lower substrate 12a may be adhered to a package substrate 70 through an adhesion layer 72. The package substrate 70 of FIG. 8 may be similar to the package substrate 40 of FIG. 5. The package substrate 70 may have a top surface 701 and a bottom surface 702 opposite to the top surface 701. As shown in FIG. 8, the package substrate 70 may include a first circuit layer (not shown), a second circuit layer 71, and a plurality of conductive vias 73. The first circuit layer may be disposed adjacent to the top surface 701 of the package substrate 70, and the second circuit layer 71 may be disposed adjacent to the bottom surface 702 of the package substrate 70. The conductive vias 73 may extend through the package substrate 70 and electrically connect the first circuit layer and the second circuit layer 71. In addition, the external connectors 79 are formed or disposed on the second circuit layer 71 of the package substrate 70 for external connection.

The package structure 1d may further include a plurality of conductive vias 128, 129 extending through the lower substrate 12a and the adhesion layer 72 and electrically connecting the top surface 701 of the package substrate 70. Thus, the lower substrate 12a is electrically connected to the package substrate 70 through the conductive vias 128, 129. In addition, the conductive elements (e.g., the conductive vias 163) of the encapsulant 16 may be bonded to and electrically connected to the conductive vias 128 of the lower substrate 12a. The solder materials 15, 18 may be bonded to and electrically connected to the conductive vias 129 of the lower substrate 12a.

The package structure 1d may include the following signal transmission paths: an inner signal transmission path 56d, a seventh signal transmission path 57d and a ninth signal transmission path 59d. The inner signal transmission path 56d is between the first electronic device (e.g., the memory device 3) and the semiconductor chip 2d. In some embodiments, the inner signal transmission path 56d may be disposed in the upper substrate 14, and data signals are transmitted in the inner signal transmission path 56d. Further, the seventh signal transmission path 57d may include the external connector 79, the conductive via 73 of the package substrate 70, the conductive via 128, the conductive element (e.g., the conductive via 163), the top surface 21 of the semiconductor chip 2d and the conductive via 27. In some embodiments, power signals may be transmitted in the seventh signal transmission path 57d. In addition, the ninth signal transmission path 59d may include the external connector 79, the conductive via 73 of the package substrate 70 and the conductive via 129. In some embodiments, exterior data signals may be transmitted in the ninth signal transmission path 59d.

Figure 9:
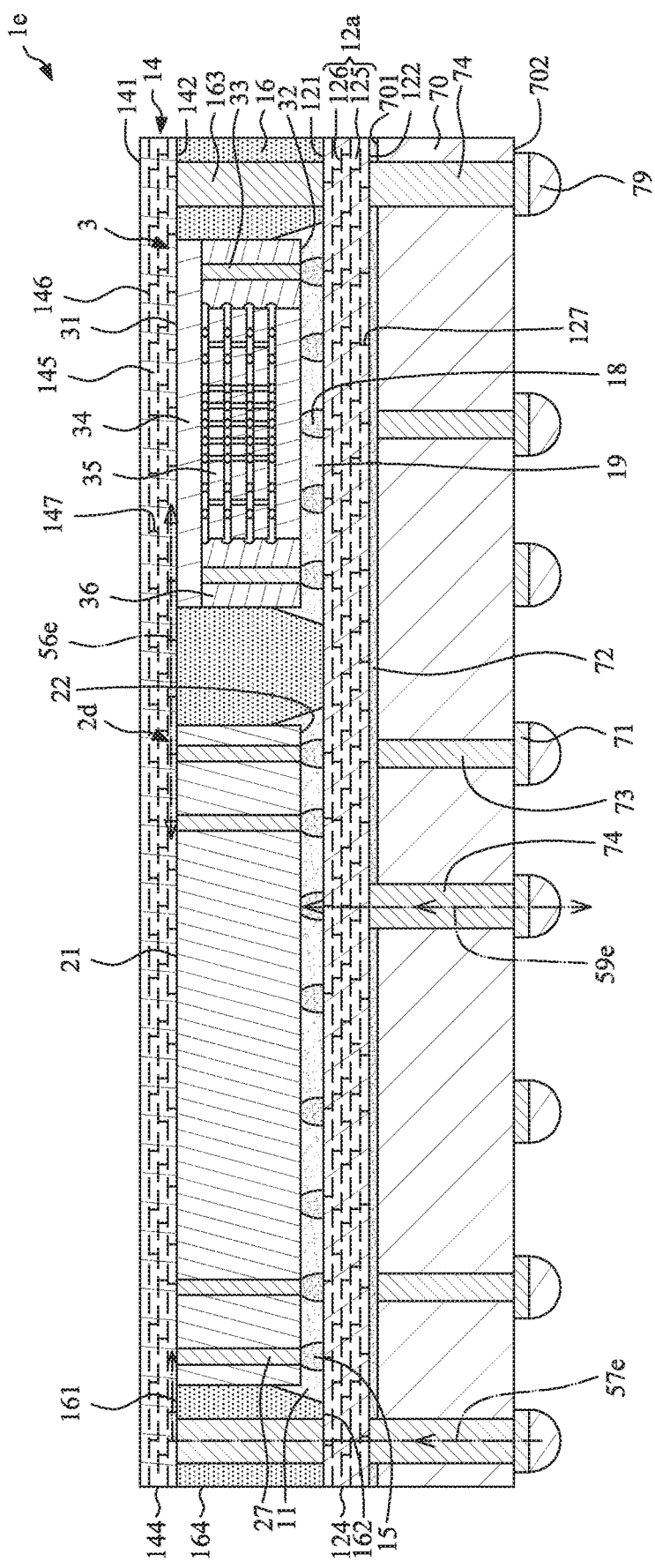
FIG. 9 illustrates a cross-sectional view of an example of a package structure according to some embodiments of the present disclosure.

FIG. 9 illustrates a cross-sectional view of an example of a package structure 1e according to some embodiments of the present disclosure. The package structure 1e of FIG. 9 is similar to the package structure 1d of FIG. 8, except that the conductive vias 128, 129 are omitted, and the conductive vias 74 are further included in the package substrate 70. The conductive vias 74 extend through the package substrate 70 and the adhesion layer 72 and electrically connects the bottom surface 122 of the lower substrate 12a. Thus, the lower substrate 12a is electrically connected to the package substrate 70 through the conductive vias 74.

The package structure 1e may include the following signal transmission paths: an inner signal transmission path 56e, a seventh signal transmission path 57e and a ninth signal transmission path 59e. The inner signal transmission path 56e of FIG. 9 may be same as the inner signal transmission path 56d of FIG. 8. Further, the seventh signal transmission path 57e may include the external connector 79, the conductive via 74 of the package substrate 70, the lower substrate 12a, the conductive element (e.g., the conductive via 163), the top surface 21 of the semiconductor chip 2d and the conductive via 27. In some embodiments, power signals may be transmitted in the seventh signal transmission path 57e. In addition, the ninth signal transmission path 59e may include the external connector 79, the conductive via 74 of the package substrate 70 and the lower substrate 12a. In some embodiments, exterior data signals may be transmitted in the ninth signal transmission path 59e.

Figure 10:
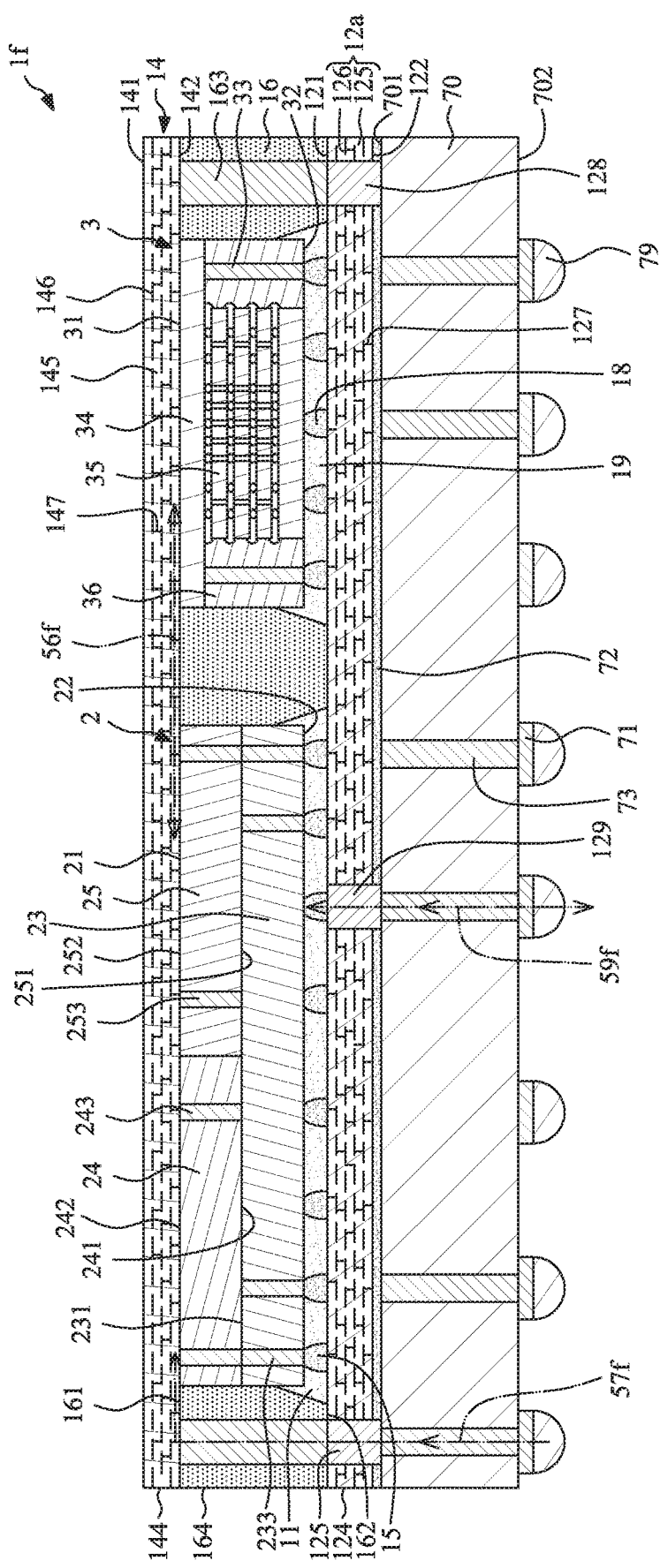
FIG. 10 illustrates a cross-sectional view of an example of a package structure according to some embodiments of the present disclosure.

FIG. 10 illustrates a cross-sectional view of an example of a package structure 1f according to some embodiments of the present disclosure. The package structure 1f of FIG. 10 is similar to the package structure 1e of FIG. 9, and except that the semiconductor chip 2d of FIG. 9 is replaced by an assembly structure 2. The assembly structure 2 of FIG. 10 may be same as the assembly structure 2 of FIG. 1.

The package structure 1f may include the following signal transmission paths: an inner signal transmission path 56f, a seventh signal transmission path 57f and a ninth signal transmission path 59f. The inner signal transmission path 56f of FIG. 10 is same as the inner signal transmission path 56 of FIG. 1. The seventh signal transmission path 57f may include the external connector 79, the conductive via 73 of the package substrate 70, the conductive via 128, the conductive element (e.g., the conductive via 163), the second surface 242 of the sub-computing section (such as the memory component 24) and the conductive via 243. In some embodiments, power signals may be transmitted in the seventh signal transmission path 57f. The ninth signal transmission path 59f may include the external connector 79, the conductive via 73 of the package substrate 70 and the conductive via 129. In some embodiments, exterior data signals may be transmitted in the ninth signal transmission path 59f.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05° For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An assembly structure, comprising:
a core-computing section; and
a sub-computing section stacked on the core-computing section;
wherein the assembly structure includes a first signal transmission path, a second signal transmission path, and an interconnection signal transmission path between the core-computing section and the sub-computing section, the first signal transmission path is from the core-computing section to the sub-computing section, the second signal transmission path passes through the sub-computing section, and a signal transmission speed in the interconnection signal transmission path is greater than a signal transmission speed in the second signal transmission path.

2. The assembly structure of claim 1, wherein a first surface of the core-computing section is an active surface, and a first surface of the sub-computing section is an active surface.

3. The assembly structure of claim 1, wherein a power signal is transmitted to at least one conductive via of the sub-computing section.

4. The assembly structure of claim 1, further comprising an electronic device, wherein the electronic device electrically connects to the core-computing section through the sub-computing section.

5. The assembly structure of claim 4, wherein the assembly structure further includes an inner signal transmission path between the electronic device and the sub-computing section, wherein a signal transmission speed in the inner signal transmission path is greater than the signal transmission speed in the second signal transmission path.

6. The assembly structure of claim 4, wherein the sub-computing section includes a memory component and a signal transmission component disposed side by side with each other, the electronic device electrically connects to the core-computing section through the signal transmission component.

7. The assembly structure of claim 4, wherein the electronic device is a memory chip.

8. A package structure, comprising:
a lower substrate;
an upper substrate; and
a stacked structure disposed between the lower substrate and the upper substrate, wherein the stacked structure includes a first electronic component and a second electronic component stacked on the first electronic component, wherein the second electronic component is disposed between the first electronic component and the upper substrate;
wherein the package structure includes a third signal transmission path, a second signal transmission path, and a third signal transmission path, the first signal transmission path is from the lower substrate to the second electronic component through the first electronic component, the second signal transmission path is from the second electronic component to the upper substrate, and the third signal transmission path is between the upper substrate and the lower substrate and across the stacked structure.

9. The package structure of claim 8, wherein the package structure further includes a fourth signal transmission path between the upper substrate and the first electronic component through the second electronic component.

10. The package structure of claim 8, further comprising:
a plurality of conductive elements disposed adjacent to the stacked structure to electrically connect the lower substrate and the upper substrate; and
an encapsulant disposed between the lower substrate and the upper substrate and covering the assembly structure and the plurality of the conductive elements.

11. The package structure of claim 8, further comprising an electronic device disposed between the lower substrate and the upper substrate, and having a top surface and a bottom surface opposite to the top surface, wherein the bottom surface of the electronic device is bonded to and electrically connected to the lower substrate, and the top surface of the electronic device is bonded to and electrically connected to the upper substrate.

12. The package structure of claim 11, further including an inner signal transmission path between the electronic device and the second electronic component.

13. The package structure of claim 8, further comprising a plurality of passive components bonded to and electrically connected to a bottom surface of the lower substrate.

14. The package structure of claim 8, further comprising a plurality of passive components disposed between the stacked structure and the lower substrate, wherein the passive components are bonded to and electrically connected to the bottom surface of the stacked structure.

15. The package structure of claim 8, further comprising:
  an electronic device having an active surface and a backside surface opposite to the active surface, wherein the active surface of the electronic device is bonded to and electrically connected to a top surface of the upper substrate; and
  a package body disposed on the top surface of the upper substrate and covering the electronic device.

16. The package structure of claim 15, further comprising:
  a top substrate disposed on the package body and electrically connected to the backside surface of the electronic device; and
  a plurality of through vias extending through the package body, and electrically connecting the top substrate and the upper substrate.

17. The package structure of claim 16, further comprising a plurality of passive components disposed between the top substrate and the electronic device, wherein the passive components are bonded to and electrically connected to the electronic device.

18. A package structure, comprising:
  an upper substrate having a top surface and a bottom surface opposite to the top surface;
  a processor chip disposed adjacent to the bottom surface of the upper substrate, the processor chip having a top surface and a bottom surface opposite to the top surface, wherein the top surface of the processor chip is closer to the upper substrate than the bottom surface of the processor chip is;
  a memory chip disposed adjacent to the top surface of the upper substrate, wherein the upper substrate is between the processor chip and the memory chip; and
  a lower substrate disposed below the processor chip and configured to electrically connect to the processor chip and the upper substrate, wherein the package structure includes a first signal transmission path from the memory chip to the upper substrate and then to the top surface of the processor chip.

19. The package structure of claim 18, wherein the processor chip includes a first electronic component and a second electronic component stacked on the first electronic component, wherein the second electronic component is disposed between the first electronic component and the upper substrate and a second signal transmission path is from the top surface of the processor chip and passes through the second electronic component, the first electronic component, and the bottom surface of the processor chip to the lower substrate.

* * * * *